(12) United States Patent
Jiang et al.

(10) Patent No.: US 9,041,373 B2
(45) Date of Patent: May 26, 2015

(54) CONSTANT ON-TIME SWITCHING CONVERTERS WITH SLEEP MODE AND CONTROL METHODS THEREOF

(71) Applicant: Chengdu Monolithic Power Systems Co., Ltd., Chengdu (CN)

(72) Inventors: Lijie Jiang, Hangzhou (CN); Xiaokang Wu, Hangzhou (CN); Qian Ouyang, Hangzhou (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 114 days.

(21) Appl. No.: 13/956,073

(22) Filed: Jul. 31, 2013

(65) Prior Publication Data

US 2014/0035654 A1    Feb. 6, 2014

(30) Foreign Application Priority Data

Aug. 1, 2012    (CN) .......................... 2012 1 0269776

(51) Int. Cl.
| | | |
|---|---|---|
| *G05F 1/00* | (2006.01) | |
| *H03K 17/16* | (2006.01) | |
| *H02M 3/158* | (2006.01) | |
| *H02M 1/00* | (2006.01) | |

(52) U.S. Cl.
CPC ................. *H03K 17/16* (2013.01); *Y02B 70/16* (2013.01); *H02M 3/158* (2013.01); *H02M 2001/0032* (2013.01)

(58) Field of Classification Search
USPC .................................................. 323/282–285
See application file for complete search history.

(56) References Cited

U.S. PATENT DOCUMENTS

| | | | | |
|---|---|---|---|---|
| 5,747,976 | A * | 5/1998 | Wong et al. .................... | 323/282 |
| 8,400,778 | B2 | 3/2013 | Hsing et al. | |
| 8,493,044 | B2 | 7/2013 | Xu et al. | |
| 8,664,929 | B2 * | 3/2014 | Fan et al. ........................ | 323/284 |
| 8,773,099 | B2 * | 7/2014 | Granger ......................... | 323/284 |
| 2012/0274293 | A1 | 11/2012 | Ren et al. | |

* cited by examiner

*Primary Examiner* — Emily P Pham
(74) *Attorney, Agent, or Firm* — Perkins Coie LLP (57) ABSTRACT

A constant on-time switching converter includes a switching circuit, an on-time control circuit, a comparing circuit and a logic circuit. The switching circuit has a first switch and is configured to provide an output voltage to a load. The on-time control circuit generates an on-time control signal to control the on-time of the first switch. The comparing circuit compares the output voltage of the switching circuit with a reference signal and generates a comparison signal. The logic circuit generates a control signal to control the first switch based on the on-time control signal and the comparison signal. When the switching frequency of the switching circuit approaches an audible range, the switching converter enters into a sleep mode, the on-time control signal is reduced to increase the switching frequency of the switching circuit.

19 Claims, 5 Drawing Sheets

CONSTANT ON-TIME SWITCHING CONVERTERS WITH SLEEP MODE AND CONTROL METHODS THEREOF

CROSS-REFERENCE TO RELATED APPLICATIONS

This application claims the benefit of CN application 201210269776.4, filed on Aug. 1, 2012, and incorporated herein by reference.

TECHNICAL FIELD

The present invention generally relate to electronic circuits, and more particularly, relate to constant on time switching converters and control methods thereof.

BACKGROUND

Constant on-time control is widely used in power supply area because of its good transient response, simple structure and smooth mode transition. In traditional switching converters with constant on time control, a switch is turned on when the output voltage of the switching converter is smaller than a reference signal, and is turned off when its on-time reaches a predetermined time threshold. The lighter the load, the longer the switching period. So the switching frequency of the constant on-time switching converter reduces along with the load. Under light load condition, the switching frequency of the switching converter may reduce into an audible range (such as 20 Hz~20 kHz) so audible noise is generated.

SUMMARY

The embodiments of the present invention are directed to a constant on-time switching converter comprising a switching circuit, an on-time control circuit, a comparing circuit and a logic circuit. The switching circuit has a first switch and is configured to provide an output voltage to a load. The on-time control circuit is configured to generate an on-time control signal which is used to control the on-time of the first switch. The comparing circuit compares the output voltage of the switching circuit with a reference signal and generates a comparison signal. The logic circuit generates a control signal to control the first switch in the switching circuit based on the on-time control signal and the comparison signal. When the switching frequency of the switching circuit approaches an audible range, the switching converter enters into a sleep mode, the on-time control signal is reduced by the on-time control circuit to increase the switching frequency of the switching circuit.

BRIEF DESCRIPTION OF THE DRAWING

The present invention can be further understood with reference to the following detailed description and the appended drawings, wherein like elements are provided with like reference numerals.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

According to embodiments of the present invention, when the switching frequency of a constant on-time switching converter approaches an audible range, the constant on-time switching converter enters into a sleep mode. The on-time of a switch in the switching converter is reduced to increase the switching frequency, so audible noise is avoided. Furthermore, since the on-time of the switch is reduced, the conduction loss of the switch is reduced and the efficiency of the switching converter is improved.

Figure 1:
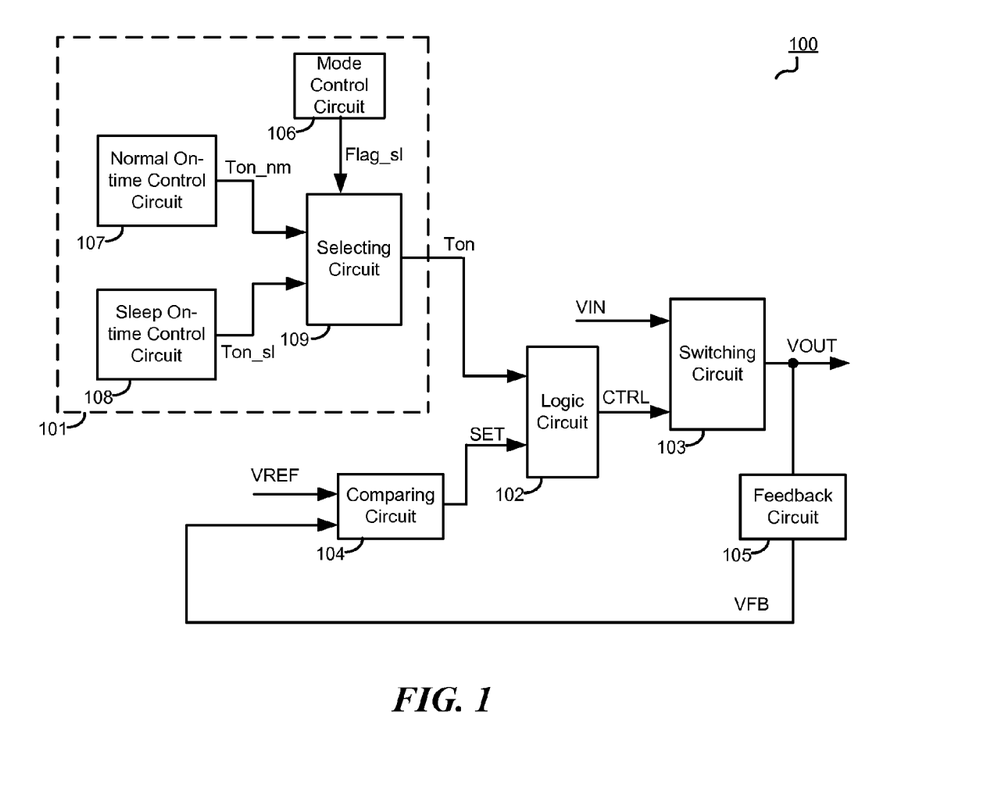
FIG. 1 is a block diagram of a constant on-time switching converter 100 in accordance with an embodiment of the present invention.

FIG. 1 is a block diagram of a constant on-time switching converter 100 in accordance with an embodiment of the present invention. The switching converter 100 comprises an on-time control circuit 101, a logic circuit 102, a switching circuit 103, a comparing circuit 104 and a feedback circuit 105. The on-time control circuit 101, the logic circuit 102 and the comparing circuit 104 may be fabricated in an integrated circuit, such as an analog IC, digital IC or analog-digital IC. The switching circuit 103 comprises a first switch and is configured to convert an input voltage VIN into an output voltage VOUT to drive a load. The switching circuit 103 may be configured in any DC/DC or AC/DC topologies, such as synchronous or asynchronous Buck, Boost, Forward and Flyback converters. The switch in the switching circuit 103 may be any controllable semiconductor device, such as MOSFET, IGBT, and so on. The feedback circuit 105 is coupled to the output terminal of the switching circuit 103 to receive the output voltage VOUT, and is configured to generate a feedback signal VFB indicative of the output voltage VOUT. Persons of ordinary skill in the art can recognize, however, that the feedback circuit 105 is not necessary and can be omitted.

The on-time control circuit 101 generates an on-time control signal Ton to control the on-time of the first switch in the switching circuit 103. The comparing circuit 104 is coupled to the feedback circuit 105, and is configured to compare the feedback signal FB with a reference signal VREF to generate a comparison signal SET. The logic circuit 102 is coupled to the on-time control circuit 101 and the comparing circuit 104. The logic circuit 102 generates a control signal CTRL based on the on-time control signal Ton and the comparison signal SET, so as to control the first switch in the switching circuit 103. Generally, the first switch is turned on when the feedback signal FB is smaller than the reference signal VREF, and is turned off when its on-time reaches a time threshold determined by the on-time control signal Ton. To avoid the audible noise, when the switching frequency Fs of the switching circuit 103 approaches an audible range (such as 20 Hz~20 kHz), the switching converter 100 enters into a sleep mode. The on-time control signal Ton is reduced by the on-time control circuit 101 to reduce the on-time of the first switch. When the on-time of the first switch is reduced, the peak value of the feedback signal FB is reduced. Since the peak value of the feedback signal FB is reduced, the off time of the first switch (during which the feedback signal FB decreases to reach the reference signal VREF) is also reduced. As a result, the switching period is reduced and the switching frequency Fs is increased.

There are many ways that can be used to judge whether the switching frequency Fs approaches the audible range. For example, the switching frequency Fs may be compared with a predetermined frequency Fth, such as 25 kHz. If the switching frequency Fs is smaller than the predetermined frequency Fth, or the switching frequency Fs is continuously smaller than the predetermined frequency in a predetermined time period, the switching frequency Fs will be deemed as approaching the audible range. The detection of the switching frequency Fs may be realized by sensing the switching period of the control signal CTRL, or be realized by other suitable means.

To prevent the switching frequency Fs from increasing too high and limiting the efficiency of the switching converter 100, in one embodiment, in the sleep mode, the on-time control signal Ton is adjusted to regulate the switching frequency Fs to be substantially equal to a sleep frequency. The sleep frequency is larger than 20 kHz, such as 25 kHz. In some embodiments, if the switching frequency Fs is larger than a maximum sleep frequency Fsl_max in the sleep mode, the switching converter 100 will exit the sleep mode and resume to normal operation.

In one embodiment, the on-time control circuit 101 comprises a mode control circuit 106, a normal on-time control circuit 107, a sleep on-time control circuit 108 and a selecting circuit 109. The normal on-time control circuit 107 is configured to generate a normal on-time control signal Ton_nm which is used to control the on-time of the first switch in normal operation. The sleep on-time control circuit 108 is configured to generate a sleep on-time control signal Ton_sl which is used to control the on-time of the first switch in the sleep mode. The mode control circuit 106 is configured to generate a mode indication signal Flag_sl based on the switching frequency Fs of the switching circuit 103. The selecting circuit 109 is coupled to the normal on-time control circuit 107, the sleep on-time control circuit 108 and the mode control circuit 106. Based on the mode indication signal Flag_sl, the selecting circuit 109 provides the normal on-time control signal Ton_nm or the sleep on-time control signal Ton_sl to the logic circuit 102 as the on-time control signal Ton.

In one embodiment, when the mode indication signal Flag_sl is logical low, the switching converter 100 works in normal operation, the selecting circuit 109 provides the normal on-time control signal Ton_nm to the logic circuit 102 as the on-time control signal Ton. When the mode indication signal Flag_sl is logical high, the switching converter 100 works in the sleep mode, the selecting circuit 109 provides the sleep on-time control signal Ton_sl to the logic circuit 102 as the on-time control signal Ton. The normal on-time control signal Ton_nm may be a predetermined constant value, or a variable value determined by the input voltage VIN and/or the output voltage VOUT.

In one embodiment, in order to eliminate the sub-harmonic oscillation at the output voltage VOUT, the switching converter 100 further comprises a slope compensation circuit providing a slope compensation signal. The slope compensation signal may be added to the feedback signal VFB, or be subtracted from the reference signal VREF.

Figure 2:
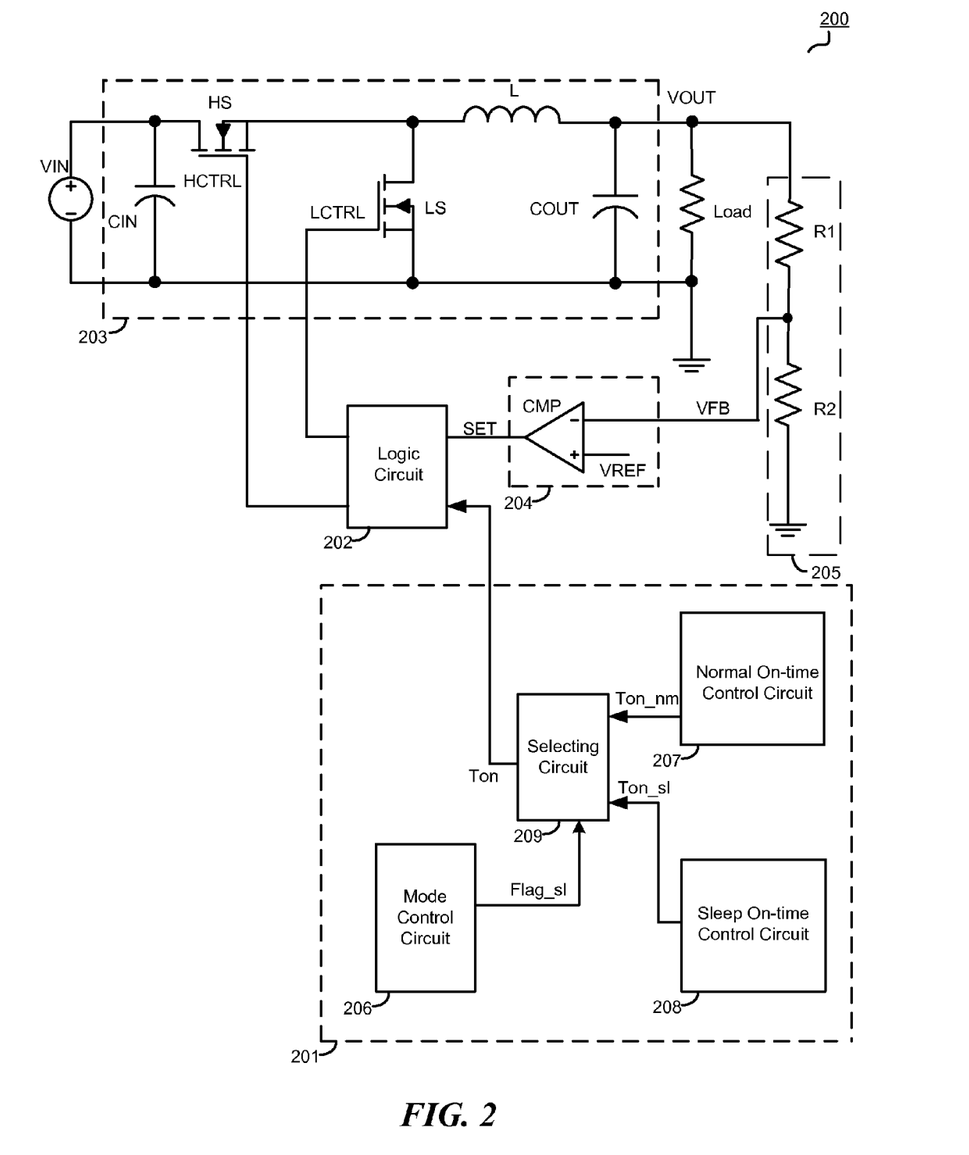
FIG. 2 schematically illustrates a constant on-time switching converter 200 in accordance with an embodiment of the present invention.

FIG. 2 schematically illustrates a constant on-time switching converter 200 in accordance with an embodiment of the present invention. The switching converter 200 comprises an on-time control circuit 201, a logic circuit 202, a switching circuit 203, a comparing circuit 204 and a feedback circuit 205. The switching circuit 203 is configured in a Buck converter. It comprises switches HS, LS, an inductor L, an input capacitor CIN and an output capacitor COUT. The feedback circuit 205 comprises a resistor divider which consists of resistors R1 and R2. The comparing circuit 204 comprises a comparator CMP. The comparator CMP has a non-inverting input terminal, an inverting input terminal and an output terminal, wherein the non-inverting input terminal is configured to receive a reference signal VREF, the inverting input terminal is coupled to the feedback circuit 205 to receive a feedback signal VFB, and the output terminal is configured to provide a comparison signal SET. Based on the comparison signal SET and an on-time control signal Ton generated by the on-time control circuit 201, the logic circuit 202 generates controls signals HCTRL and LCTRL to control the switches HS and LS.

To timely and efficiently avoid the audible noise, in one embodiment, if the switching frequency is smaller than a predetermined frequency Fth (such as 25 kHz), the switch LS will be turned on to discharge the output capacitor COUT until the feedback signal VFB becomes smaller than the reference signal VREF. In one embodiment, the switching frequency Fs will be deemed as approaching the audible noise and the switching converter 200 will enter into the sleep mode only if the switching frequency Fs is continuously smaller than the predetermined frequency Fth in a predetermined time period T1 (such as 5 seconds).

In some embodiments, the switch LS is used as a synchronous switch. When the feedback signal VFB is smaller than the reference signal VREF, the switch HS is turned on and the switch LS is turned off. When the on-time of the switch HS reaches a time threshold determined by the on-time control signal Ton, the switch HS is turned off, the switch LS is turned on for freewheeling. Under light load condition, the body diode of the switch LS is used for freewheeling, so as to reduce the switching loss.

Figure 3:
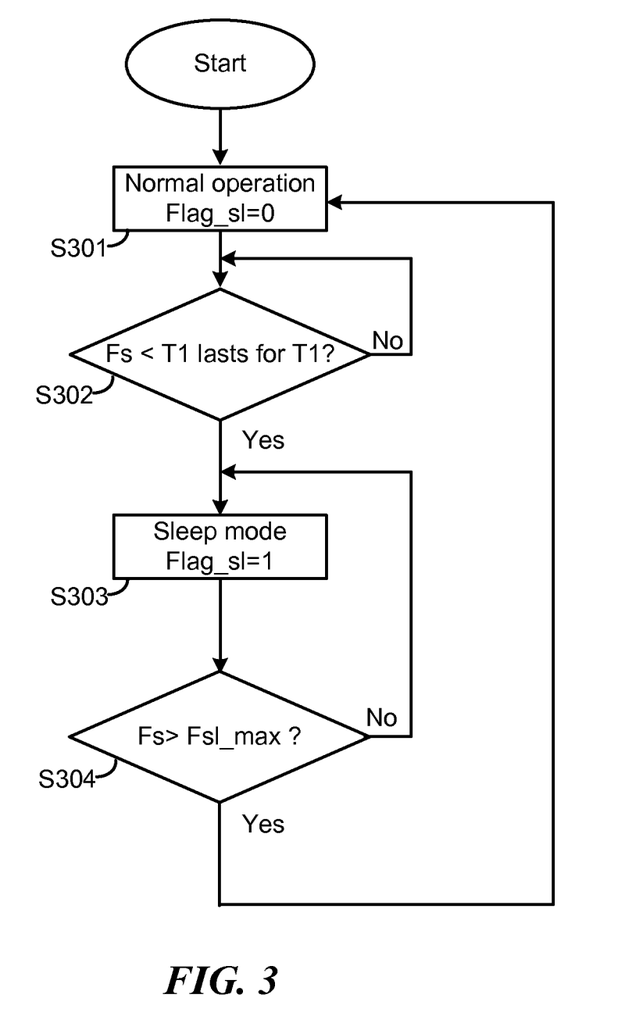
FIG. 3 is a working flowchart of the switching converter 200 shown in FIG. 2, in accordance with an embodiment of the present invention.

FIG. 3 is a working flowchart of the switching converter 200 shown in FIG. 2, in accordance with an embodiment of the present invention. It comprises steps S301~S304.

At step S301, the switching converter 200 works in normal operation and the mode indication signal Flag_sl is logical low. The selecting circuit 209 provides the normal on-time control signal Ton_nm to the logic circuit 202 as the on-time control signal Ton.

At step S302, whether the switching frequency Fs is continuously smaller than the predetermined frequency Fth in the predetermined time period T1 is detected. If yes, go to step S303, else, keep detecting.

At step S303, the switching converter 200 enters into the sleep mode and the mode indication signal Flag_sl is logical high. The selecting circuit 209 provides the sleep on-time control signal Ton_sl to the logic circuit 202 as the on-time control signal Ton.

At step S304, whether the switching frequency Fs is larger than a maximum sleep frequency Fsl_max (such as 40 kHz) is detected. If the switching frequency Fs is larger than the maximum sleep frequency Fsl_max, go to step S301, the switching converter 200 exits the sleep mode and resumes to normal operation. Else, go to step S303, the switching converter 200 continues working in the sleep mode.

Figure 4:
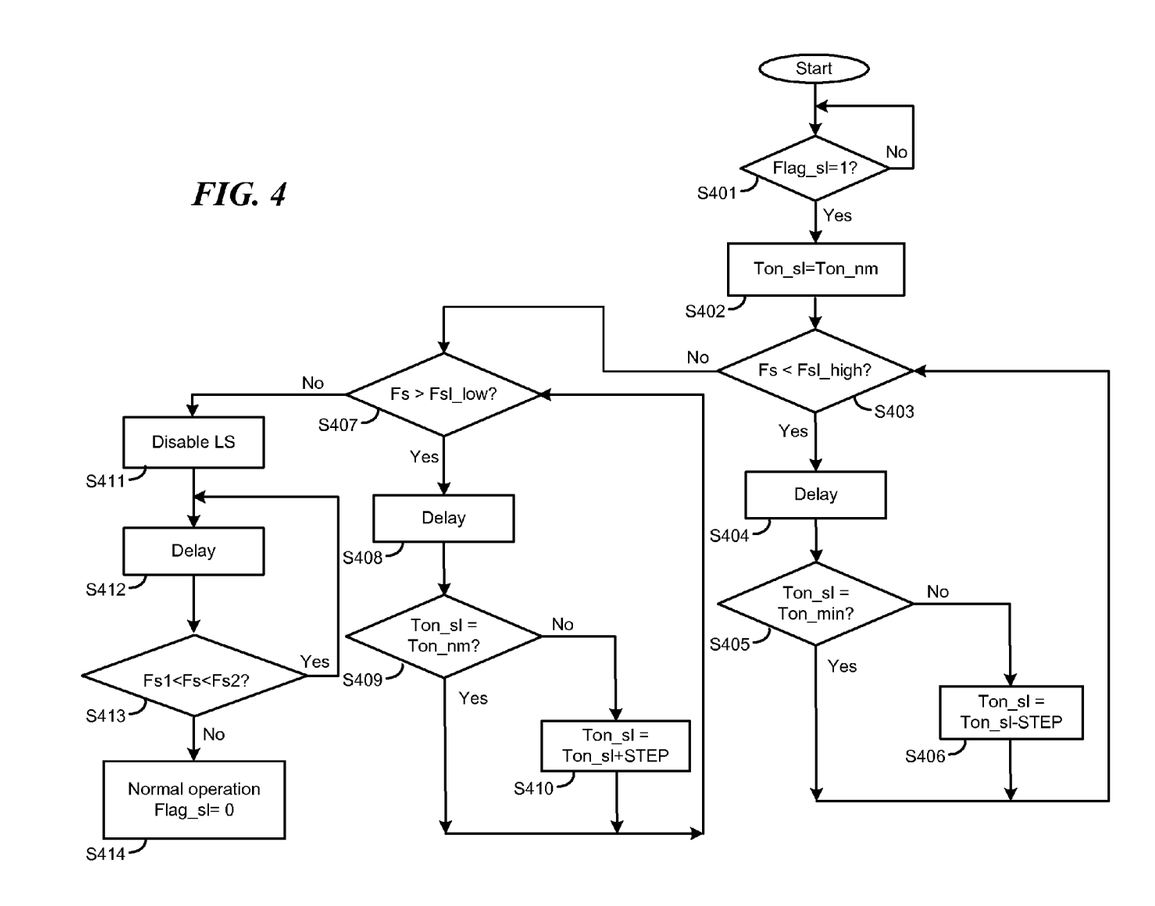
FIG. 4 is a working flowchart in sleep mode of the switching converter 200 shown in FIG. 2, in accordance with an embodiment of the present invention.

FIG. 4 is a working flowchart in sleep mode of the switching converter 200 shown in FIG. 2, in accordance with an embodiment of the present invention. It comprises steps S401~S414.

At step S401, whether the mode indication signal Flag_sl is logical high is detected. If the mode indication signal Flag_sl is logical high, go to step S402, else, keep detecting.

At step S402, the sleep on-time control signal Ton_sl is set to be equal to the normal on-time control signal Ton_nm.

At step S403, whether the switching frequency Fs is smaller than a high sleep threshold frequency Fsl_high (such as 28.5 kHz) is detected. If the switching frequency Fs is smaller than the high sleep threshold frequency Fsl_high, go to step S404, else, go to step S407.

At step S404, delay is processed.

At step S405, whether the sleep on-time control signal Ton_sl is equal to a minimum on-time signal Ton_min is detected. If the sleep on-time control signal Ton_sl is equal to the minimum on-time signal Ton_min, go to step S403, else, go to step S406.

At step S406, a step signal STEP is subtracted from the sleep on-time control signal Ton_sl.

At step S407, whether the switching frequency Fs is larger than a low sleep threshold frequency Fsl_low is detected. If the switching frequency Fs is larger than the low sleep threshold frequency Fsl_low, go to step S408, else, go to step S411. The low sleep threshold frequency Fsl_low may be equal to the predetermined frequency Fth, such as 25 kHz.

At step S408, delay is processed.

At step S409, whether the sleep on-time control signal Ton_sl is equal to the normal on-time control signal Ton_nm is detected. If the sleep on-time control signal Ton_sl is equal to the normal on-time control signal Ton_nm, go to step S407, else, go to step S410.

At step S410, the step signal STEP is added to the sleep on-time control signal Ton_sl.

At step S411, the second switch is disabled so it won't be turned on even if the switching frequency Fs is smaller than the predetermined frequency Fth.

At step S412, delay is processed.

At step S413, whether the switching frequency Fs is in a predetermined frequency range Fs1~Fs2 (such as 20 kHz~30 kHz) is detected. If the switching frequency Fs is in the predetermined frequency range, go to step S412, else, go to step S414.

At step S414, the switching converter 200 exits the sleep mode and resumes to normal operation. The mode indication signal Flag_sl is changed into logical low.

The delay time in steps S404, S408 and S412 may be determined by practical applications. In some applications, these delay steps may be omitted. In one embodiment, the normal on-time control signal Ton_nm, the sleep on-time control signal Ton_sl and the on-time control signal Ton are all digital signals, and the step signal STEP is equal to 1 LSB (least significant bit).

Figure 5:
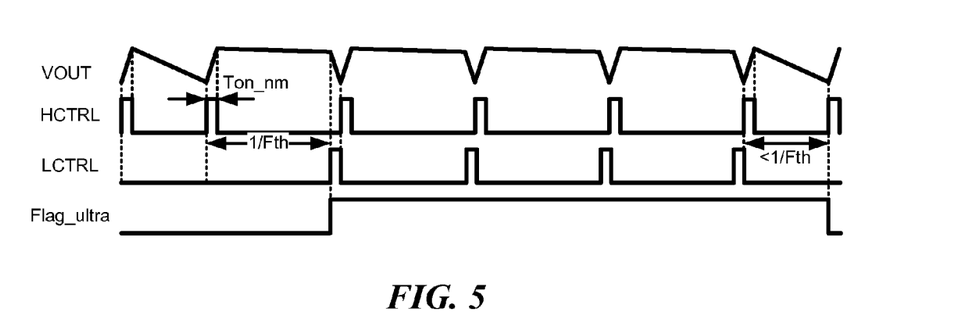
FIG. 5 is a working waveform in normal operation of the switching converter 200 shown in FIG. 2, in accordance with an embodiment of the present invention.

FIG. 5 is a working waveform in normal operation of the switching converter 200 shown in FIG. 2, in accordance with an embodiment of the present invention, wherein Flag_ultra is a signal indicating whether the switching frequency Fs is smaller than the predetermined frequency Fth. As shown in FIG. 5, in normal operation, the on-time of the switch HS is determined by the normal on-time control signal Ton_nm. When the switching frequency Fs is larger than the predetermined frequency Fth, which means the switching period is smaller than 1/Fth, the signal Flag_ultra is logical low and the switch LS is turned off. When the switching frequency Fs is smaller than the predetermined frequency Fth, which means the switching period is larger than 1/Fth, the signal Flag_ultra is logical high. The switch LS is turned on to discharge the output capacitor COUT until the feedback signal FB becomes smaller than the reference signal VREF.

Figure 6:
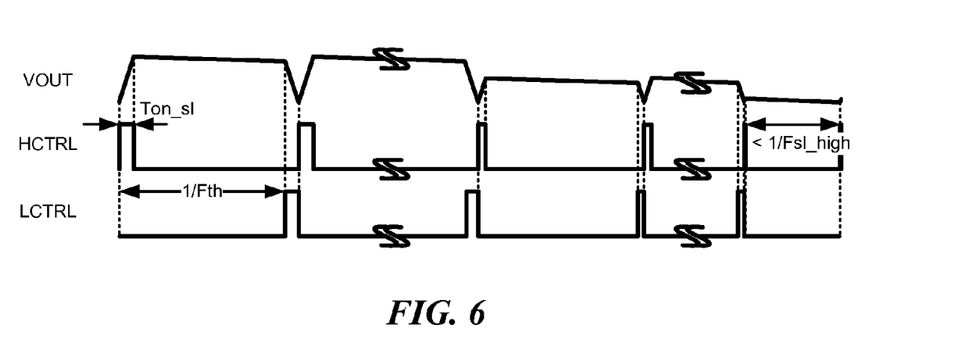
FIG. 6 and FIG. 7 are working waveforms in sleep mode of the switching converter 200 shown in FIG. 2, in accordance with an embodiment of the present invention.
Figure 7:
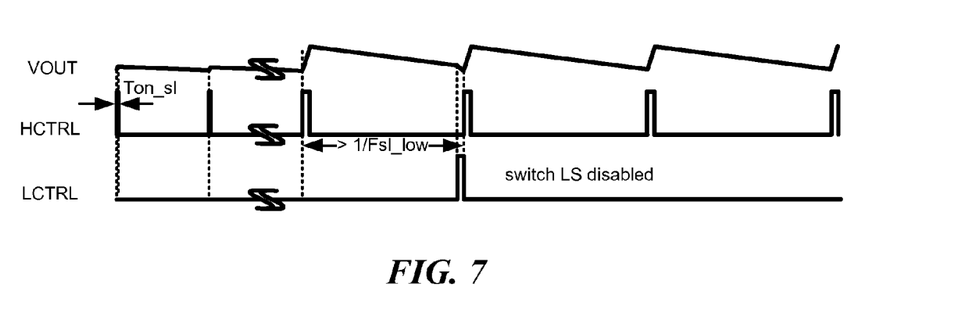

FIG. 6 and FIG. 7 are working waveforms in sleep mode of the switching converter 200 shown in FIG. 2, in accordance with an embodiment of the present invention, wherein the on-time of the switch HS is determined by the sleep on-time control signal Ton_sl. As shown in FIG. 6, after the switching converter 200 enters into the sleep mode, the sleep on-time control signal Ton_sl is gradually reduced and the switching frequency Fs is gradually increased, until the switching frequency Fs becomes larger than or equal to the high sleep threshold frequency Fsl_high. As shown in FIG. 7, after the switching frequency Fs becomes larger than or equal to the high sleep threshold frequency Fsl_high, the sleep on-time control signal Ton_sl is gradually increased and the switching frequency Fs is gradually decreased, until the switching frequency Fs becomes smaller than or equal to the low sleep threshold frequency Fsl_low. The switch LS is disabled after the switching frequency Fs becomes smaller than or equal to the low sleep threshold frequency Fsl_low.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

We claim:

1. A controller used in a constant on-time switching converter, wherein the switching converter comprises a switching circuit having a first switch and configured to provide an output voltage to a load, the controller comprises:
   an on-time control circuit configured to generate an on-time control signal;
   a comparing circuit coupled to the switching circuit, wherein the comparing circuit compares the output voltage of the switching circuit with a reference signal and generates a comparison signal; and
   a logic circuit coupled to the on-time control circuit and the comparing circuit, wherein based on the on-time control signal and the comparison signal, the logic circuit generates a control signal to control the first switch in the switching circuit; wherein
   when a switching frequency of the switching circuit approaches an audible range, the switching converter enters into a sleep mode, the on-time control signal is reduced by the on-time control circuit to increase the switching frequency of the switching circuit.

2. The controller of claim 1, wherein the on-time control circuit comprises:
   a normal on-time control circuit configured to generate a normal on-time control signal;
   a sleep on-time control circuit configured to generate a sleep on-time control signal;
   a mode control circuit configured to generate a mode indication signal; and
   a selecting circuit coupled to the normal on-time control circuit, the sleep on-time control circuit and the mode control circuit, wherein based on the mode indication signal, the selecting circuit provides the normal on-time control signal or the sleep on-time control signal to the logic circuit as the on-time control signal.

3. The controller of claim 1, wherein in the sleep mode, the on-time control signal is adjusted to regulate the switching frequency to be substantially equal to a sleep frequency, wherein the sleep frequency is larger than 20 kHz.

4. The controller of claim 1, wherein if the switching frequency is larger than a maximum sleep frequency in the sleep mode, the switching converter will exit the sleep mode and resume to normal operation.

5. The controller of claim 1, wherein the switching circuit further comprises a second switch and an output capacitor coupled to the load in parallel, and wherein if the switching frequency is smaller than a predetermined frequency, the second switch will be turned on to discharge the output capacitor until the output voltage becomes smaller than the reference signal.

6. The controller of claim 5, wherein if the switching frequency is continuously smaller than the predetermined frequency in a predetermined time period, the switching frequency will be deemed as approaching the audible range, and the switching converter will enter into the sleep mode.

7. A constant on-time switching converter, comprising:
   a switching circuit having a first switch, wherein the switching circuit is configured to provide an output voltage to a load;
   an on-time control circuit configured to generate an on-time control signal;
   a comparing circuit coupled to the switching circuit, wherein the comparing circuit compares the output voltage of the switching circuit with a reference signal and generates a comparison signal; and
   a logic circuit coupled to the on-time control circuit and the comparing circuit, wherein based on the on-time control signal and the comparison signal, the logic circuit generates a control signal to control the first switch in the switching circuit; wherein
   a switching frequency of the switching circuit is compared with a predetermined frequency to detect whether the switching frequency approaches an audible range, and wherein when the switching frequency approaches the audible range, the switching converter enters into a sleep mode, the on-time control signal is reduced by the on-time control circuit to increase the switching frequency of the switching circuit.

8. The switching converter of claim 7, wherein the on-time control circuit comprises:
   a normal on-time control circuit configured to generate a normal on-time control signal;
   a sleep on-time control circuit configured to generate a sleep on-time control signal;
   a mode control circuit configured to generate a mode indication signal; and
   a selecting circuit coupled to the normal on-time control circuit, the sleep on-time control circuit and the mode control circuit, wherein based on the mode indication signal, the selecting circuit provides the normal on-time control signal or the sleep on-time control signal to the logic circuit as the on-time control signal.

9. The switching converter of claim 7, wherein in the sleep mode, the on-time control signal is adjusted to regulate the switching frequency to be substantially equal to a sleep frequency, wherein the sleep frequency is larger than 20 kHz.

10. The switching converter of claim 7, wherein if the switching frequency is larger than a maximum sleep frequency in the sleep mode, the switching converter will exit the sleep mode and resume to normal operation.

11. The constant on-time switching converter of claim 7, wherein the switching circuit further comprises a second switch and an output capacitor coupled to the load in parallel, and wherein if the switching frequency is smaller than the predetermined frequency, the second switch will be turned on to discharge the output capacitor until the output voltage becomes smaller than the reference signal.

12. The constant on-time switching converter of claim 7, wherein if the switching frequency is continuously smaller than the predetermined frequency in a predetermined time period, the switching frequency will be deemed as approaching the audible range, and the switching converter will enter into the sleep mode.

13. A constant on-time control method used in a switching converter, wherein the switching converter comprises a switching circuit having a first switch and configured to provide an output voltage to a load, the control method comprises:
   generating an on-time control signal;
   comparing the output voltage of the switching circuit with a reference signal and generating a comparison signal;
   generating a control signal to control the first switch in the switching circuit based on the on-time control signal and the comparison signal;
   judging whether a switching frequency of the switching circuit approaches an audible range; and
   when the switching frequency of the switching circuit approaches the audible range, entering into a sleep mode and reducing the on-time control signal to increase the switching frequency of the switching circuit.

14. The control method of claim 13, wherein in the sleep mode, the on-time control signal is adjusted to regulate the switching frequency to be substantially equal to a sleep frequency, wherein the sleep frequency is larger than 20 kHz.

15. The control method of claim 13, further comprising: if the switching frequency is larger than a maximum sleep frequency in the sleep mode, leaving the sleep mode and resuming to normal operation.

16. The control method of claim 13, wherein the switching circuit further comprises a second switch and an output capacitor coupled to the load in parallel, and wherein the control method further comprises: if the switching frequency is smaller than a predetermined frequency, turning on the second switch to discharge the output capacitor until the output voltage becomes smaller than the reference signal.

17. The control method of claim 16, wherein if the switching frequency is continuously smaller than the predetermined frequency in a predetermined time period, the switching frequency will be deemed as approaching the audible range, and the switching converter will enter into the sleep mode.

18. The control method of claim 16, wherein after entering into a sleep mode, the control method further comprises:
   gradually reducing the on-time control signal until the switching frequency reaches a high sleep threshold frequency;

gradually increasing the sleep on-time control signal until the switching frequency reaches than a low sleep threshold frequency; and disabling the second switch so the second switch won't be turned on even if the switching frequency is smaller than the predetermined frequency.

19. The control method of claim 18, wherein the low sleep threshold frequency is equal to the predetermined frequency.

\* \* \* \* \*